(12) United States Patent
Soda

(10) Patent No.: US 7,488,691 B2
(45) Date of Patent: Feb. 10, 2009

(54) METHOD OF FABRICATING SEMICONDUCTOR DEVICE

(75) Inventor: Eiichi Soda, Ibaraki (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 15 days.

(21) Appl. No.: 11/826,641

(22) Filed: Jul. 17, 2007

(65) Prior Publication Data
US 2008/0020562 A1    Jan. 24, 2008

(30) Foreign Application Priority Data
Jul. 19, 2006    (JP)    ............... 2006-197239

(51) Int. Cl.
*H01L 21/302*    (2006.01)
*G06F 17/50*    (2006.01)
*G06F 9/45*    (2006.01)
*G06F 7/66*    (2006.01)

(52) U.S. Cl. ............... 438/725; 716/4; 716/5; 700/129

(58) Field of Classification Search ............... 438/765; 257/E21.492, E21.575, E23.151; 700/119–121; 716/4–5, 19–21; 430/4–5; 378/34–35
See application file for complete search history.

(56) References Cited

U.S. PATENT DOCUMENTS 5,986,477 A * 11/1999 Jiang et al. ............... 326/101

2004/0172610 A1 * 9/2004 Liebmann et al. ............... 716/19
2007/0259291 A1 * 11/2007 Bucchignano et al. ...... 430/313

FOREIGN PATENT DOCUMENTS

| JP | 2002-93778 | 3/2002 |
| JP | 2002-270584 | 9/2002 |
| JP | 2004-47511 | 2/2004 |
| JP | 2004-281832 | 10/2004 |
| JP | 2005-203563 | 7/2005 |
| JP | 2006-53543 | 2/2006 |

* cited by examiner

*Primary Examiner*—Ha Tran T Nguyen
*Assistant Examiner*—Karen M Kusumakar
(74) *Attorney, Agent, or Firm*—McGinn IP Law Group, PLLC

(57) ABSTRACT

A method of fabricating a semiconductor device of the present invention includes a step (S100) of judging whether an interconnect pitch of an interconnect pattern having the smallest interconnect pitch out of all interconnect patterns to be formed in the insulating film is not larger than a predetermined value or not; a step (S104) of determining the thickness of the lower resist film corresponding to the interconnect pitch, if the interconnect pitch is judged as being not larger than a predetermined pitch, in the step of judging whether the interconnect pitch is not smaller than the predetermined value; and a step (S106) of forming, on the insulating film, the lower resist film having the thickness determined in step S104 by using a multi-layered resist.

10 Claims, 10 Drawing Sheets

100

100 ation No. 2006-197239 the content of which is incorporated hereinto by reference.
METHOD OF FABRICATING SEMICONDUCTOR DEVICE This application is based on Japanese patent application No. 2006-197239 the content of which is incorporated hereinto by reference.

BACKGROUND

1. Technical Field

The present invention relates to a method of fabricating a semiconductor device.

2. Related Art

Interconnect pitch has been becoming narrower with progress of dimensional shrinkage in recent semiconductor devices. In view of fabricating such leading-edge semiconductor devices, there is an increasing trend of using a multi-layered resist film composed of a plurality of resist films. In the multi-layered resist film, the upper resist film is first patterned by light exposure, and the resultant pattern is transferred to the lower film(s).

The conventional multi-layered resist film has been suffering from a problem in that the upper resist film is likely to cause collapse of pattern, as being affected by developer solution or rinse solution after the exposure. Japanese Laid-Open Patent Publication No. 2005-203563 describes a technique of forming a photosensitive film after cleaning the surface of a coating-type insulating film, followed by irradiation by an energy beam and development so as to form a photosensitive film pattern, thereby suppressing collapse/dropping of the photosensitive film pattern.

Another known problem is separation between a film-to-be-etched and the lower film thereof. Japanese Laid-Open Patent Publication No. 2002-093778 describes a technique by which a mask pattern composed of an oxide film such as SOG is formed on an organic film, an organic film which lies under the SOG film is etched through thus-patterned SOG film used as a mask, in a plasma of mixed gas of ammonia gas and oxygen gas. By this process, it is described that the separation at the interface between the oxide film and the organic film can be prevented, ensuring a highly accurate etched geometry.

Japanese Laid-Open Patent Publication No. 2006-53543 discloses a configuration in which the lower layer for the two-layered or three-layered resist process contains a polymer compound obtained by copolymerizing indenes with a compound containing a hydroxyl group or epoxy group together with a polymerizable double bond. This configuration reportedly has an excellent resistance against etching.

Japanese Laid-Open Patent Publication No. 2002-270584 describes a technique of the multi-layered resist process in which a fluorine component is added to an etching gas used for etching the lower resist film through a patterned intermediate layer used as a mask. The publication describes that the thickness of the lower film in the multi-layered film was successfully reduced to as thin as 250 nm or around.

Japanese Laid-Open Patent Publication No. 2004-47511 describes a technique of removing, using an inert gas plasma, residual electric charge of a wafer adsorbed to an electrostatic chuck by applying, to the chuck electrode, a charge removing voltage equivalent to the self-bias potential of the wafer during the plasma application. This configuration allows rapid and stable release of an object adsorbed onto the electrostatic chuck.

Japanese Laid-Open Patent Publication No. 2004-281832 describes a technique of loading/unloading a semiconductor substrate to or from the chambers of a semiconductor process apparatus, in which the semiconductor substrate is loaded/unloaded between each process chamber and a common transfer chamber, only when the pressure in each of the process chambers becomes lower than that of the common transfer chamber.

The present inventors found out that sometimes the lower film of the multi-layered resist also collapsed depending on conditions. Unlike the upper resist film, the lower resist film is patterned by dry etching. Because the lower resist film is not affected by a developer solution unlike the upper resist film, pattern collapse thereof has not conventionally been recognized as a problem. For this reason, there has been no technique ever developed for suppressing collapse of the lower resist film pattern.

SUMMARY

In one embodiment, there is provided a method of fabricating a semiconductor device including forming, in an insulating film formed over a semiconductor substrate, an interconnect pattern with a predetermined geometry, using a multi-layered resist film containing at least a lower resist film and a silicon-containing film, comprising: judging whether an interconnect pitch of an interconnect pattern having the smallest interconnect pitch out of all interconnect patterns to be formed in the insulating film is not larger than a predetermined value or not; if the interconnect pitch is judged as being not larger than a predetermined pitch, in the step judging whether the interconnect pitch is not smaller than a predetermined value, determining the thickness of the lower resist film corresponding to the interconnect pitch; forming the lower resist film having the thickness on the insulating film; forming the silicon-containing film on the lower resist film; patterning the silicon-containing film according to the predetermined geometry; patterning the lower resist film through the silicon-containing film used as a mask; and patterning the insulating film through the lower resist film used as a mask.

By this method of fabricating a semiconductor device for the case of having fine interconnect patterns, the thickness of the lower resist film is controlled so as to suppress the aspect ratio of the lower resist film to as small as not larger than a predetermined value, and thereby the pattern collapse of the lower resist film can be suppressed. The predetermined pattern can therefore be formed into the insulating film which is a film-to-be-etched. As a consequence, it is made possible to improve reliability of the semiconductor device, increase the yield of the semiconductor chip.

FIG. 9 is a sectional view showing a configuration of a semiconductor device containing a layer having wide line areas and a narrow line area formed therein. In the wide line area, the interconnect pitch is generally set to the micrometer level or larger. On the other hand, with progress of scaling of semiconductor devices, the interconnect pitch in the narrow line area is set typically to 80 nm, 100 nm, 120 nm, 140 nm, 160 nm or the like. The lower resist film may possibly collapse in such the narrow line area, whereas the present invention can prevent the pattern collapse, because the thickness of the lower resist film is determined corresponding to the interconnect pitch in the narrow line area. The predetermined value of the interconnect pitch can appropriately be set, depending on materials adopted for the lower resist film and the interconnect pattern in the individual layers.

As one example, the method of fabricating a semiconductor device of the present invention may include forming, over a semiconductor substrate, a film-to-be-etched, a lower resist film, a silicon-containing intermediate layer, and an upper resist film, patterning the upper resist film according to a predetermined geometry, etching the silicon-containing intermediate layer through thus-patterned upper resist used as a mask, etching the lower resist film through the upper resist and the silicon-containing intermediate layer used as masks, and etching the film-to-be-etched through the silicon-containing intermediate layer and the lower resist film used as masks.

As another example, the method of fabricating a semiconductor device of the present invention may include forming, over a semiconductor substrate, a film-to-be-etched, a lower resist film, and a silicon-containing upper resist film (intermediate layer), patterning the silicon-containing upper resist film according to a predetermined geometry, etching the lower resist film through thus-patterned silicon-containing upper resist used as a mask, and etching the film-to-be-etched through the silicon-containing upper resist and the lower resist film used as masks.

It is to be understood that any arbitrary combinations of the above-described constituents, and any expressions of the present invention exchanged among method, apparatus and so forth are also effective as embodiments of the present invention.

According to the present invention, a desired pattern can be formed in a film-to-be-etched by etching through a multi-layered resist. Reliability of the semiconductor device can therefore be improved, and thereby production yield of the semiconductor chip can be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
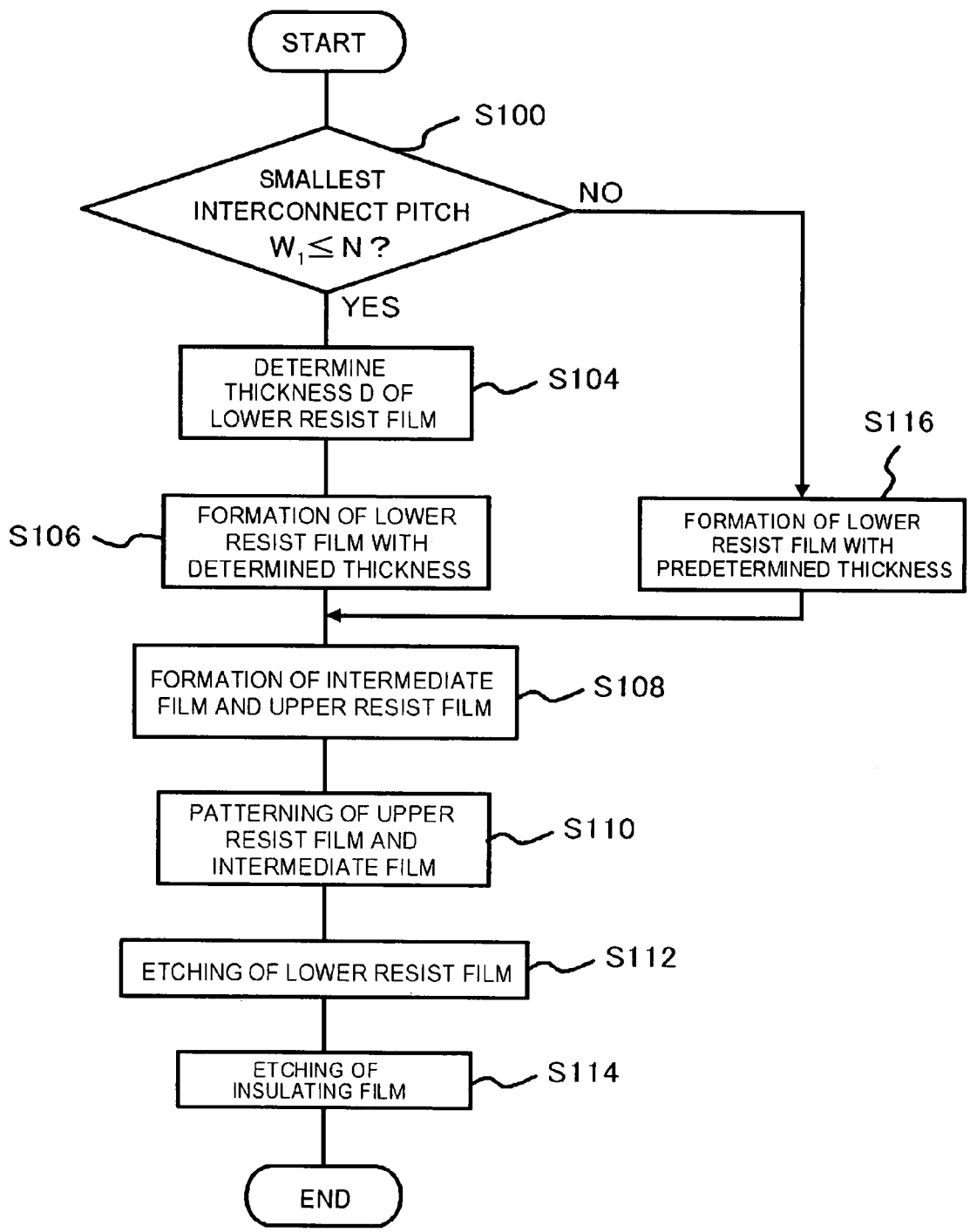
FIG. 1 is a flow chart showing procedures of etching an insulating film, which is a film-to-be-etched, in one embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention, referring to the attached drawings. It is to be noted that any similar constituents will be given with the same reference numerals, so as to avoid repetitive explanation.

The present inventors found out that one of causes of collapse of the lower resist film resides in electric charge remaining on the surface of the lower resist film. In the course of etching of the lower resist film, a semiconductor wafer is fixed by adsorption using an electrostatic chuck (ESC). In the course of etching, the surface of the resist is charged negative by the self-bias potential (Vdc) of plasma. For these reasons, formation of dense pattern of the lower resist film raises charge-induced attractive force or repulsive force between the adjacent resist patterns, and results in collapse. The present inventors then conceived techniques of suppressing the collapse of the lower resist film, as described below:

(1) the aspect ratio of the lower resist film with respect to the line width is set to a predetermined value or below;

(2) electric charge on the surface of the wafer is removed after etching of the lower resist film; and/or (3) fluctuation in pressure over the duration of time after completion of etching of the lower resist film until etching of the film-to-be-etched is reduced.

First Embodiment

Figure 2:
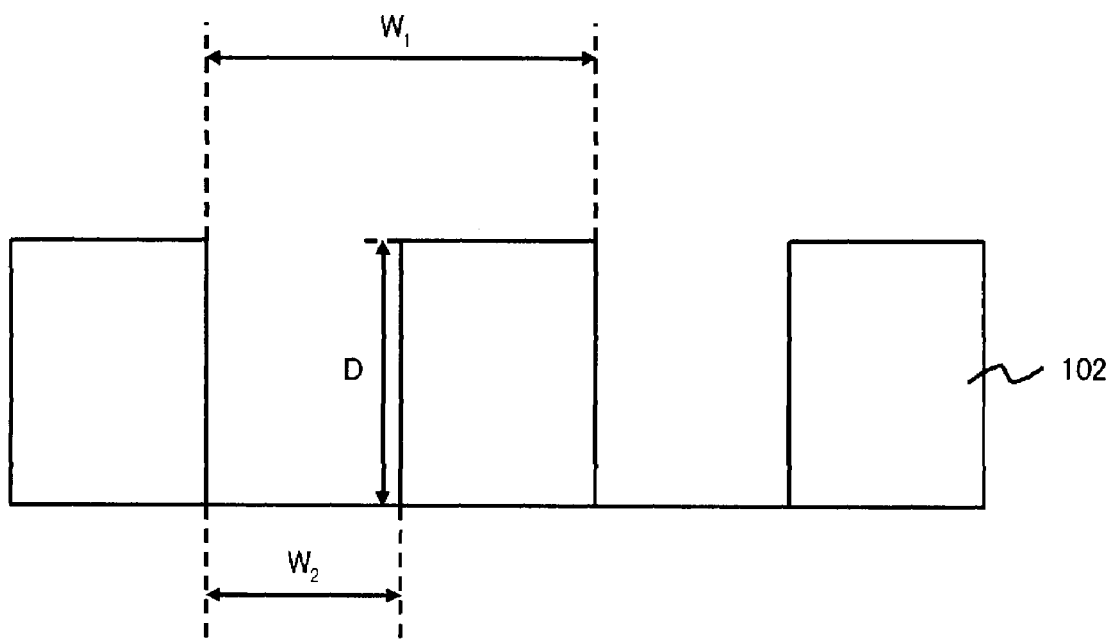
FIG. 2 is a drawing showing a configuration of a lower resist film.

In this embodiment, a method of preventing the collapse of the lower resist film based on the technique (1) in the above will be explained. FIG. 1 is a flow chart showing procedures of etching an insulating film, which is a film-to-be-etched, to thereby form an interconnect pattern according to a predetermined geometry, in this embodiment. FIG. 2 is a drawing showing a configuration of a lower resist film 102. Explanation will be given below referring to FIG. 1 and FIG. 2.

Etching through the multi-layered resist film in this embodiment includes the process steps of:

judging whether an interconnect pitch $W_1$ of an interconnect pattern having the smallest interconnect pitch out of all interconnect patterns to be formed in the insulating film is not larger than a predetermined value N or not (S100);

if the interconnect pitch $W_1$ is judged as being not larger than a predetermined pitch N (YES in S100), in the judging whether the interconnect pitch $W_1$ is not smaller than a predetermined value N or not, determining the thickness D of the lower resist film 102 corresponding to the interconnect pitch $W_1$ (S104);

forming the lower resist film 102 having the thickness D on the film-to-be-etched (S106);

forming the intermediate layer (silicon-containing film) and the upper resist film on the lower resist film 102 (S108);

patterning the upper resist film and the intermediate layer according to the predetermined geometry (S110);

transferring the pattern of the upper resist film to the lower resist film 102 (S112); and patterning the film-to-be-etched through the lower resist film 102 used as a mask.

In this embodiment, the predetermined value N may be set to 140 nm. More specifically, in this embodiment, a process of controlling the thickness D of the lower resist film 102 is executed, when the fine patterns having an interconnect pitch $W_1$ of 140 nm or smaller is contained. In step S104, the thickness of the lower resist film 102 may be determined, so that the interconnect pattern having the smallest interconnect pitch will have an aspect ratio ($D/W_2$: where $W_2$ is line width) of 2.5 or smaller. The line width $W_2$ may be set to $\frac{1}{2}W_1$, and the line width $W_2$: space ($W_1-W_2$) may be set to 1:1 in the interconnect pitch.

In step S100, the lower resist film 102 is formed to a preset thickness, when the interconnect pitch $W_1$ is larger than the predetermined value N (NO in S100) (S116). Although the description herein showed an exemplary case where the line width $W_2$ space ($W_1$-$W_2$) is 1:1 in the interconnect pitch, the present invention is applicable also to the case where the line width $W_2$: space ($W_1$-$W_2$) has other values such as 1:2, 1:3 and the like in the interconnect pitch.

Figure 3A:
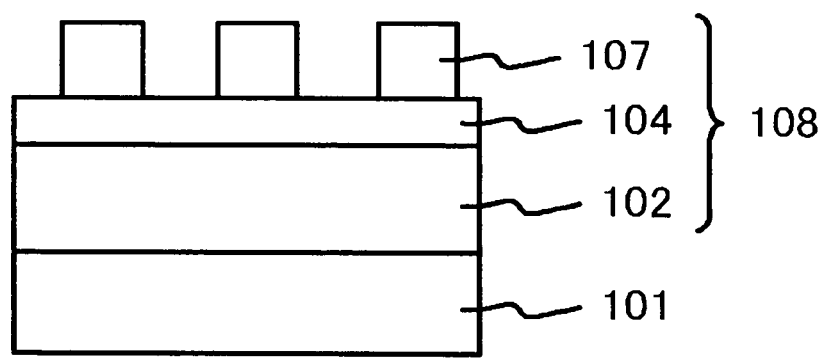
FIGS. 3A to 3C are step-wise sectional views showing procedures of forming a pattern using a three-layered resist film.
Figure 3B:
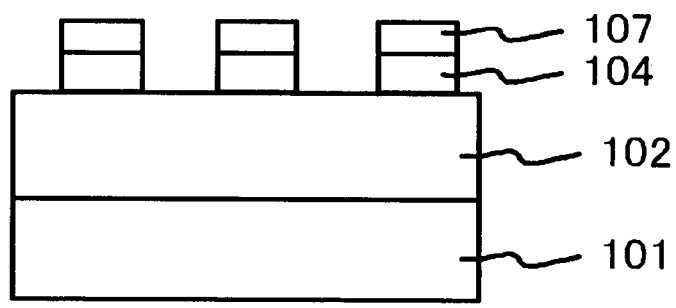
Figure 3C:
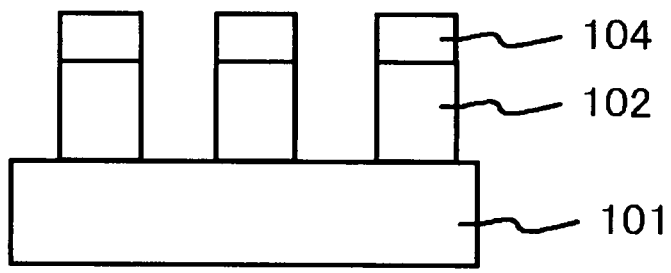

In this embodiment, an exemplary case where the multi-layered resist film is a three-layered resist film will be explained. FIGS. 3A to 3C are step-wise sectional views showing procedures of forming a pattern using a three-layered resist film.

First, on a semiconductor substrate (not shown), a film-to-be-etched 101, the lower resist film 102, an intermediate film 104, and an upper resist film 107 are formed in this order.

The film-to-be-etched 101 may typically be composed of a low-k film such as a porous SiOC film. The thickness of the film-to-be-etched 101 may typically be adjusted equal to or more than 50 nm and equal to or less than 120 nm. The film-to-be-etched 101 may typically be formed by the CVD process.

The lower resist film 102 may be configured by a carbon-rich film having a large carbon concentration. Use of the carbon-rich film can reduce LER (line edge roughness) after the etching, and can suppress side-etching.

The lower resist film 102 may more preferably be configured as containing aromatic rings. For example, the lower resist film 102 may be configured by novolac resin, acrylic resin, copolymer of novolac resin and acrylic resin, hydroxystyrene-base resins or the like. The lower resist film 102 may be formed by spin coating. For the case where the lower resist film 102 is formed by spin coating in this embodiment, the material may be diluted, or the number of rotation during drop-wise supply of the material may be increased than usual. For example, the lower resist film 102 may be formed by spin coating, while diluting the material twice, and adjusting the number of rotation during the drop-wise supply of the material at 1,500 rpm according to the standard procedure. Alternatively, the lower resist film 102 may be formed by spin coating, without diluting the material but increasing the number of rotation during the drop-wise supply of the material to as large as 2,500 rpm. By these procedures, the thickness of the lower resist film 102 can be thinned by 100 nm or around thinner than usual.

Still alternatively, the lower resist film 102 may be formed by the CVD process. The lower resist film 102 can thus be controlled to a desired thickness.

The thickness of the lower resist film 102 is determined by the processes in step S100 and step S104 in FIG. 1. In general, the thickness of the lower resist film 102 may typically be adjusted to 70 nm or more and 400 nm or less. In this embodiment, if the interconnect pitch $W_1$ of the interconnect pattern having the smallest interconnect pitch out of all interconnect patterns to be formed in the film-to-be-etched 101 is not larger than 140 nm, the thickness of the lower resist film 102 is determined so as to adjust the aspect ratio (D/$W_2$) of the interconnect pattern having the smallest interconnect pitch to 2.5 or smaller.

The lower limit of the thickness of the lower resist film 102 may be determined depending on the thickness of the film-to-be-etched 101, and etching selectivity between the lower resist film 102 and the film-to-be-etched 101. The thickness of the lower resist film 102 may be set so as to adjust the aspect ratio of the lower resist film 102 to 0.8 or larger. This configuration allows the lower resist film 102 to function as a mask, without being etched even when the etching selectivity between the film-to-be-etched 101 and the lower resist film 102 is small (2.1, for example).

The intermediate film 104 may be a silicon-containing film. The intermediate film 104 may be exemplified by $SiO_2$ film, SiC film, SiN film, SiCN film, SiOC film, SiOCH film and so forth. In this embodiment, the intermediate film 104 may be $SiO_2$ film. The $SiO_2$ film may be formed by the spin-on-glass process, CVD process, and so forth. The thickness of the intermediate film 104 may typically be adjusted approximately equal to or more than 20 nm and equal to or less than 100 nm.

The upper resist film 107 may be such as being used as the upper resist film 107 in the general multi-layered resist film 108. The upper resist film 107 may be formed typically by coating process. The thickness of the upper resist film 107 may be adjusted typically equal to or more than 50 nm and equal to or less than 300 nm.

Next, the upper resist film 107 is subjected to light exposure according to the general method, so as to pattern the upper resist film 107 (FIG. 3A). The light exposure may be effected by F2 lithography or EPL (electron projection lithography). In this embodiment, the interconnect pattern may be targeted at 140 nm pitch in the hp (half-pitch) 45-nm node, up to 90 nm pitch in the hp32-nm node. Exposure apparatus may be any of those using I-line, KrF, ArF, immersion ArF, EUV and so forth.

Next, the intermediate film 104 is patterned by etching through thus-patterned upper resist film 107 used as a mask (FIG. 3B). The intermediate film 104 may be patterned by dry etching typically using fluorocarbon-base gas. In this process, also the upper resist film 107 is etched, and thinned as a consequence.

Thereafter, the lower resist film 102 is patterned by reactive ion etching (RIE) through the stacked film of the upper resist film 107 and the intermediate film 104 used as a mask (FIG. 3C). By this process, the pattern is transferred to the lower resist film 102. Oxygen-based mixed gas may be used as a gas for the reactive ion etching, so as to ensure etching selectivity between the intermediate film 104 and the lower resist film 102. The gas for the reactive ion etching may contain at least $O_2$, and may be optionally added with $N_2$, CO, He or Ar. In this process, also the upper resist film 107 is removed.

Thereafter, the film-to-be-etched 101 is patterned by dry etching through the stacked film of the intermediate film 104 and the lower resist film 102 used as a mask.

EXAMPLE

The thickness of the upper resist film 107 and the thickness of the intermediate film 104 were adjusted to 90 nm and 35 nm, respectively. EP-038 (from Tokyo Ohka Kogyo Co., Ltd.) was used for the upper resist film 107, and SHB-A629 (from Shin-Etsu Chemical Co., Ltd.) was used for the intermediate film 104. B200 (JSR Corporation) was used for the lower resist film 102. The thickness of the lower resist film 102 was adjusted to 150 nm, 180 nm, 200 nm, 250 nm and 300 nm. The interconnect pattern was configured as containing a dense pattern having 90 nm to 140 nm pitches. The dense pattern portion of thus-configured semiconductor device was observed under a scanning electron microscope (SEM), and presence or absence of collapse of the lower resist film 102 was evaluated. Line patterns of 1 mm long were evaluated, since longer line pattern more distinctively shows collapse of patterns.

As a consequence, the lower resist film 102 of 140 nm pitch showed no collapse under film thickness of 150 nm and 180 nm. On the other hand, the lower resist film 102 of 140 nm pitch showed collapse under film thickness of 200 nm and 300 nm. It is therefore understood that the lower resist film 102 does not collapse under an aspect ratio of 2.57 (180 nm/70 nm=2.57) or below.

In the region containing both of 90-nm pitch to 120-nm pitch, the lower resist film 102 showed no collapse under a film thickness of 150 nm, but showed collapse under a film thickness of 180 nm or larger. Considering now on the basis of 120-nm pitch, it is understood that the lower resist film 102 having a film thickness of 150 nm does not collapse under an aspect ratio of 2.5 (150 nm/60 nm=2.5) or below.

As has been described above in this embodiment, the collapse of the lower resist film 102, contained in the multi-layered resist film 108 for forming 140-nm pitch to 90-nm pitch interconnects corresponded to the hp45 nm node to hp32 nm node, can be suppressed by controlling the thickness of the lower resist film 102 so as to adjust the aspect ratio to a predetermined value (2.5, in this case) or below. A desired pattern can therefore be formed in the film-to-be-etched 101. As a consequence, the reliability of the semiconductor device can be improved, the yield of the semiconductor chip can be increased.

Second Embodiment

This embodiment differs from the first embodiment in that the techniques (1) and (2) described above are adopted in combination. In this embodiment, a step in which electric charge on the surface of the wafer is removed (charge removal) is added between step S112 and step S114 in FIG. 1.

Figure 4:
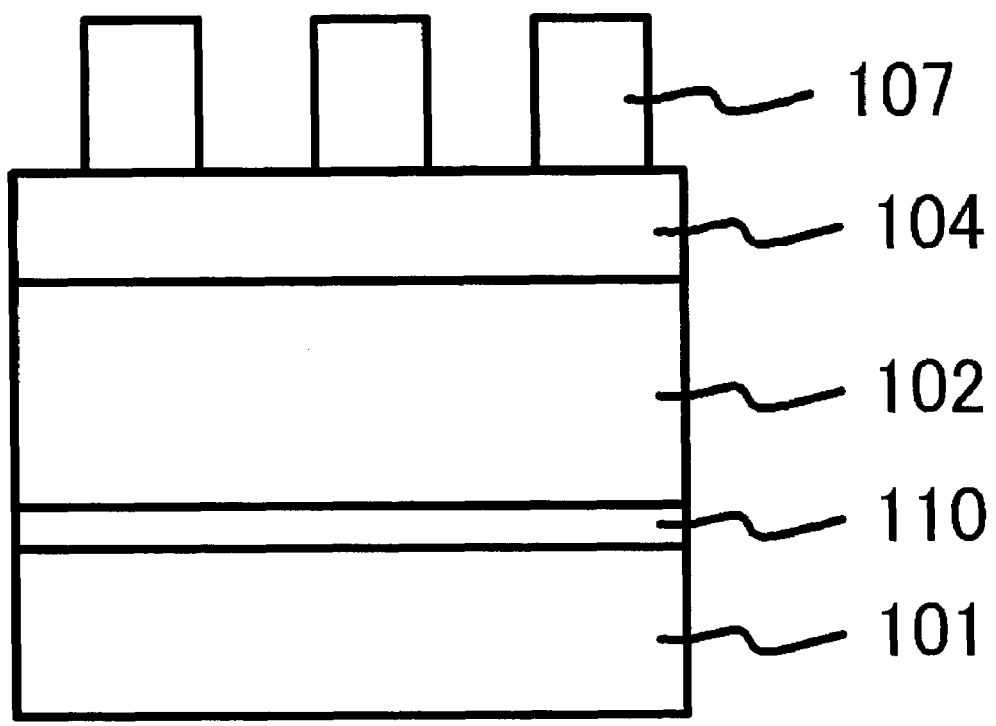
FIG. 4 is a sectional view showing a configuration of a semiconductor device according to one embodiment of the present invention.

FIG. 4 is a sectional view showing a configuration of a semiconductor device 100 in this embodiment.

As one example, in place of forming the lower resist film 102 directly on the film-to-be-etched 101, an electro-conductive film 110 may be formed in between. The thickness of the electro-conductive film 110 may be adjusted to 10 nm, for example.

Alternatively, an electro-conductive material may be used for the lower resist film 102 in this embodiment.

Figure 5:
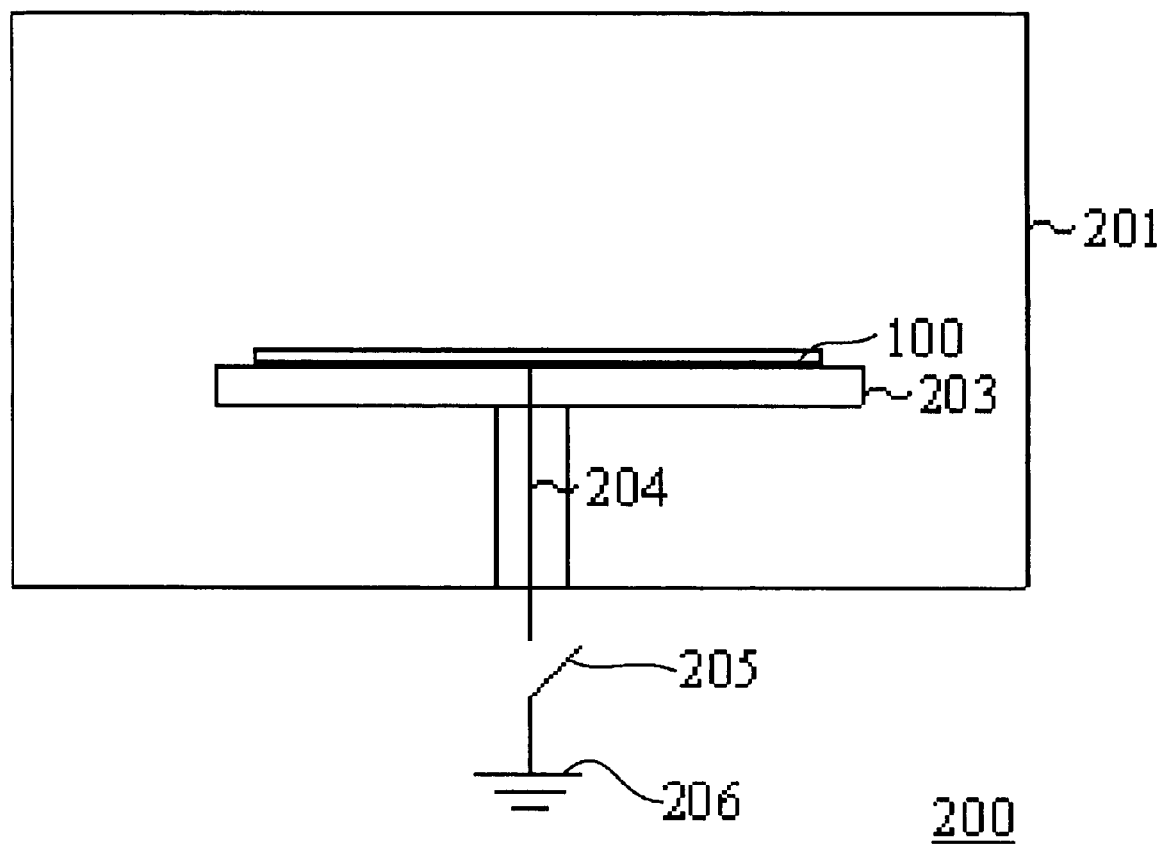
FIG. 5 is a schematic drawing showing a configuration of an etching apparatus used in the embodiment of the present invention.

FIG. 5 is a schematic drawing showing a configuration of an etching apparatus used in this embodiment.

The etching apparatus 200 includes a chamber 201, an electrostatic chuck 203, a grounding wire 204 and a switch 205. The semiconductor device 100 is placed on the electrostatic chuck 203. The grounding wire 204 is configured as being brought into contact with the back surface of the semiconductor substrate of the semiconductor device 100 placed on the electrostatic chuck 203. The grounding wire 204 is connected to a grounding point 206 via the switch 205 outside the chamber 201. In the etching apparatus 200 in this embodiment, the switch 205 is disconnected when the lower resist film is etched in step S112 of FIG. 1. After completion of step S112, the switch 205 is turned on, and thereby the semiconductor substrate of the semiconductor device 100 is grounded. Alternatively, in place of the configuration having the switch provided thereto, the grounding point 206 is configured as being movable, so as to ground the semiconductor substrate having the semiconductor device 100 formed thereon, after completion of step S112 in FIG. 1.

Figure 6:
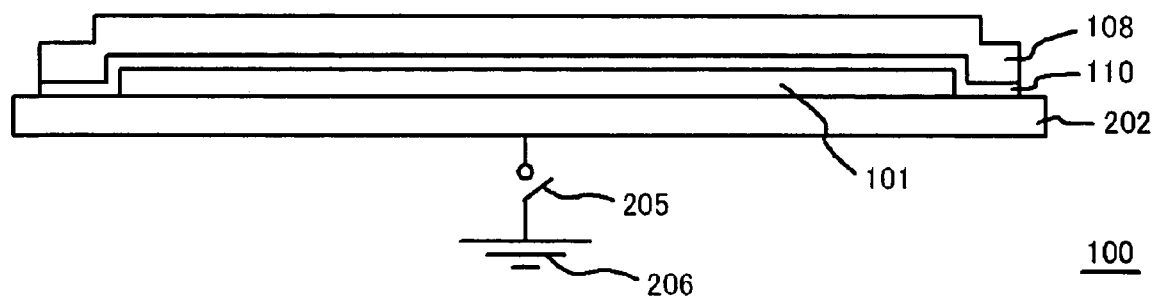
FIGS. 6 to 8 are sectional views showing configurations of the semiconductor device allowing charge removal using the etching apparatus shown in FIG. 5.
Figure 7:
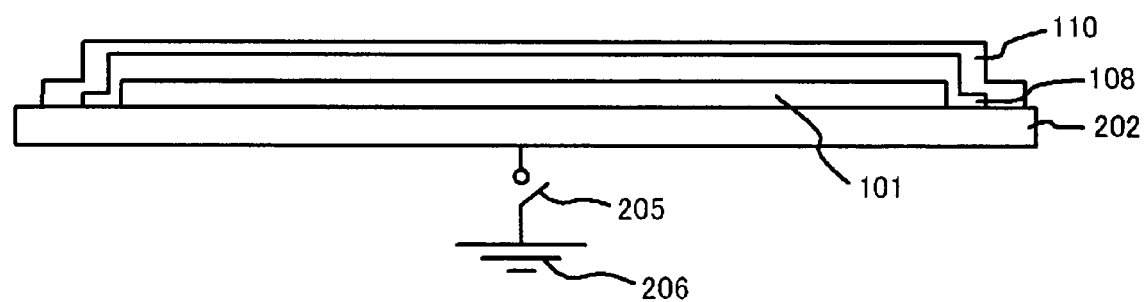
Figure 8:
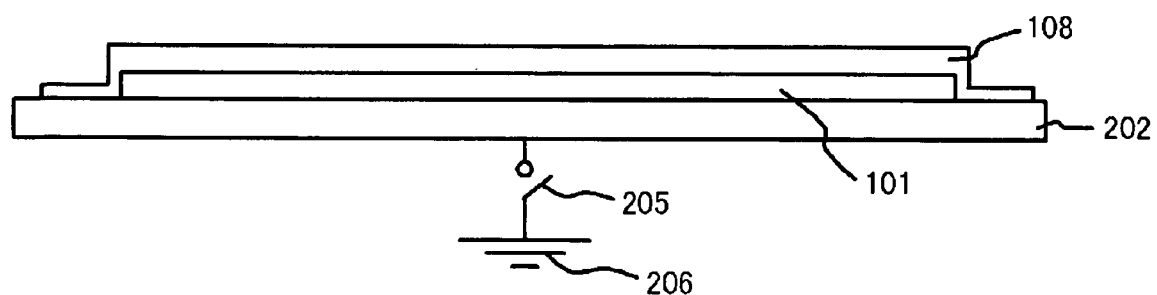
Figure 9:
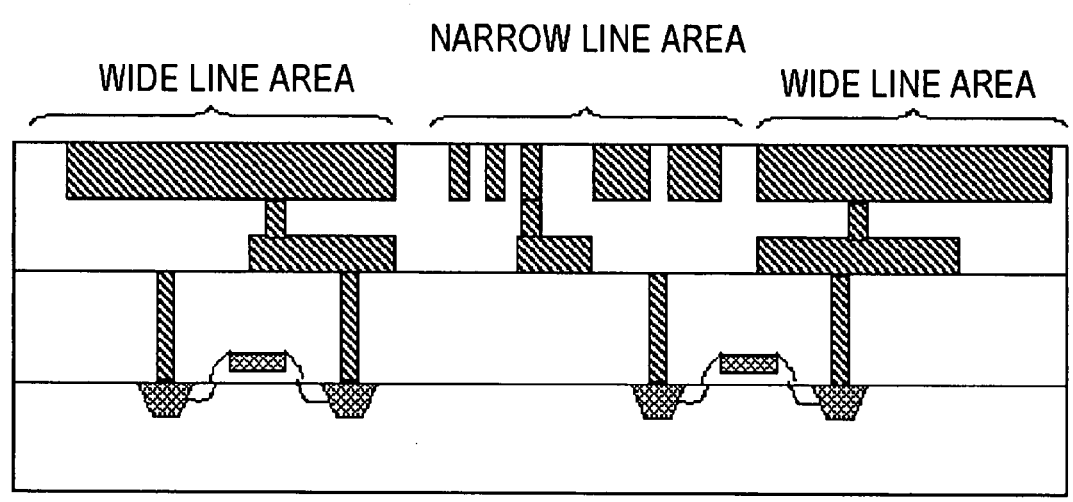
FIG. 9 is a sectional view showing a configuration of a semiconductor device containing a layer having wide line areas and a narrow line area formed therein.

FIG. 6 to FIG. 8 are sectional views schematically showing configurations of the semiconductor device 100 subjected to the charge removal process using the etching apparatus 200 shown in FIG. 5.

FIG. 6 shows an exemplary case where an electro-conductive film 110 is provided between the film-to-be-etched 101 and the multi-layered resist film 108. The electro-conductive film 110 is provided on the periphery of the semiconductor substrate 202, as being brought into contact with the semiconductor substrate 202. More specifically, the electro-conductive film 110 is formed as having the diameter larger than that of the film formed thereunder, such as the film-to-be-etched 101, and is provided in contact with the semiconductor substrate 202 at the peripheral portion thereof. In this configuration, grounding of the semiconductor substrate 202 results in grounding of the electro-conductive film 110. As a consequence, electric charge accumulated in the lower resist film 102 (not shown in FIG. 6) of the multi-layered resist film 108 is removed through the electro-conductive film 110. The semiconductor substrate 202 may be grounded until the electric potential of the semiconductor substrate 202 becomes zero. The semiconductor substrate 202 may be grounded for a duration of time typically as long as the electric potential of the semiconductor substrate 202 falls to zero, while using an instrument of measuring the electric potential of the semiconductor substrate 202. Alternatively, the duration of time after which the electric potential of the semiconductor substrate 202 falls to zero may preliminarily be determined, and the grounding may be effected only over such duration of time.

As is clear from the above, for the case where the electro-conductive film 110 is provided between the lower resist film 102 and the film-to-be-etched 101, the thickness of the lower resist film 102 is determined as including also the thickness of the electro-conductive film 110.

FIG. 7 shows an exemplary case where the electro-conductive film 110 is formed on the multi-layered resist film 108. Also in this embodiment, the electro-conductive film 110 is provided in contact with a semiconductor substrate 202 in the periphery of the semiconductor substrate 202. Although the configuration in which also the multi-layered resist film 108 is brought in contact with the semiconductor substrate 202 in the periphery of the semiconductor substrate 202 is shown in the drawing, the multi-layered resist film 108 may be formed to a size same as that of the film-to-be-etched 101, as being not brought into contact with the semiconductor substrate 202. Alternatively, it is also allowable, for example, to form only the lower resist film 102 (not shown in FIG. 7) of the multi-layered resist film 108 as being larger in diameter than the film formed thereunder, such as the film-to-be-etched 101, and as being brought into contact with the electro-conductive film 110 formed thereon. Also in the configuration shown in FIG. 7, electric charge accumulated in the multi-layered resist film 108 is removed through the electro-conductive film 110.

FIG. 8 is a drawing showing an exemplary case where an electro-conductive material is used for the lower resist film 102 (not shown in FIG. 8). In this case, the lower resist film 102 is provided in contact with the semiconductor substrate 202 in the periphery of said semiconductor substrate 202.

Materials described in the next may be used for the lower resist film 102, when the lower resist film 102 is configured by using an electro-conductive material. The lower resist film 102 may be configured typically by a polymer having conjugated double bonds in the basic skeleton thereof, and may be configured as being added with a trace amount of electron-donative or electron-receptive chemical substance (dopant). The lower resist film 102 will therefore have negative charge, and can dramatically be improved in the electro-conductivity. More specifically, the lower resist film 102 can be configured by polyacetylene, polyparaphenylene, poly(phenylene vinylene), polypyrrole, polythiophene, polyaniline or the like. By using this sort of material, the reactivity of the film-to-be-etched 101 during etching is reduced, and thereby selectivity with respect to the film-to-be-etched 101 increases. As a consequence, improvement in the etching resistivity is expectable, even if the lower resist film 102 is thin. It is to be understood, that also the electro-conductive film 110 can be configured using the same material.

In the semiconductor devices 100 shown in FIG. 6 to FIG. 8, the film-to-be-etched 101 and so forth may be formed, while avoiding formation thereof onto the periphery of the semiconductor substrate 202. Alternatively, the film-to-be-etched 101 may be formed over the entire surface of the semiconductor substrate 202, and may be subjected to bevel etching to thereby expose the semiconductor substrate 202 in the periphery of the semiconductor substrate 202. By forming, thereafter, the electro-conductive film 110 and the lower resist film 102 over the entire surface of the semiconductor substrate 202, the semiconductor devices 100 configured as shown in FIG. 6 to FIG. 8 can be obtained.

In this embodiment, collapse of the lower resist film 102 can be suppressed similarly to as in the embodiment, by controlling the thickness of the lower resist film 102 of the multi-layered resist film 108 so that the aspect ratio thereof is adjusted to a predetermined value. In addition, according to the method of fabricating the semiconductor device 100 of this embodiment, the collapse of resist can effectively be suppressed, by removing residual charge remaining in the lower resist film 102 after being etched, so as to eliminate electrostatic force exerted between the adjacent resist patterns. A desired pattern can be formed in the film-to-be-etched 101. As a consequence, the reliability of the semiconductor device can be improved, and the production yield of the semiconductor device can be improved.

Alternatively, in the process of the above-described charge removal, it is also allowable in this embodiment to determine the thickness D of the lower resist film in step S104 in FIG. 1, so as to make the aspect ratio larger than 2.5 which is a value described in the first embodiment.

Third Embodiment

Figure 10:
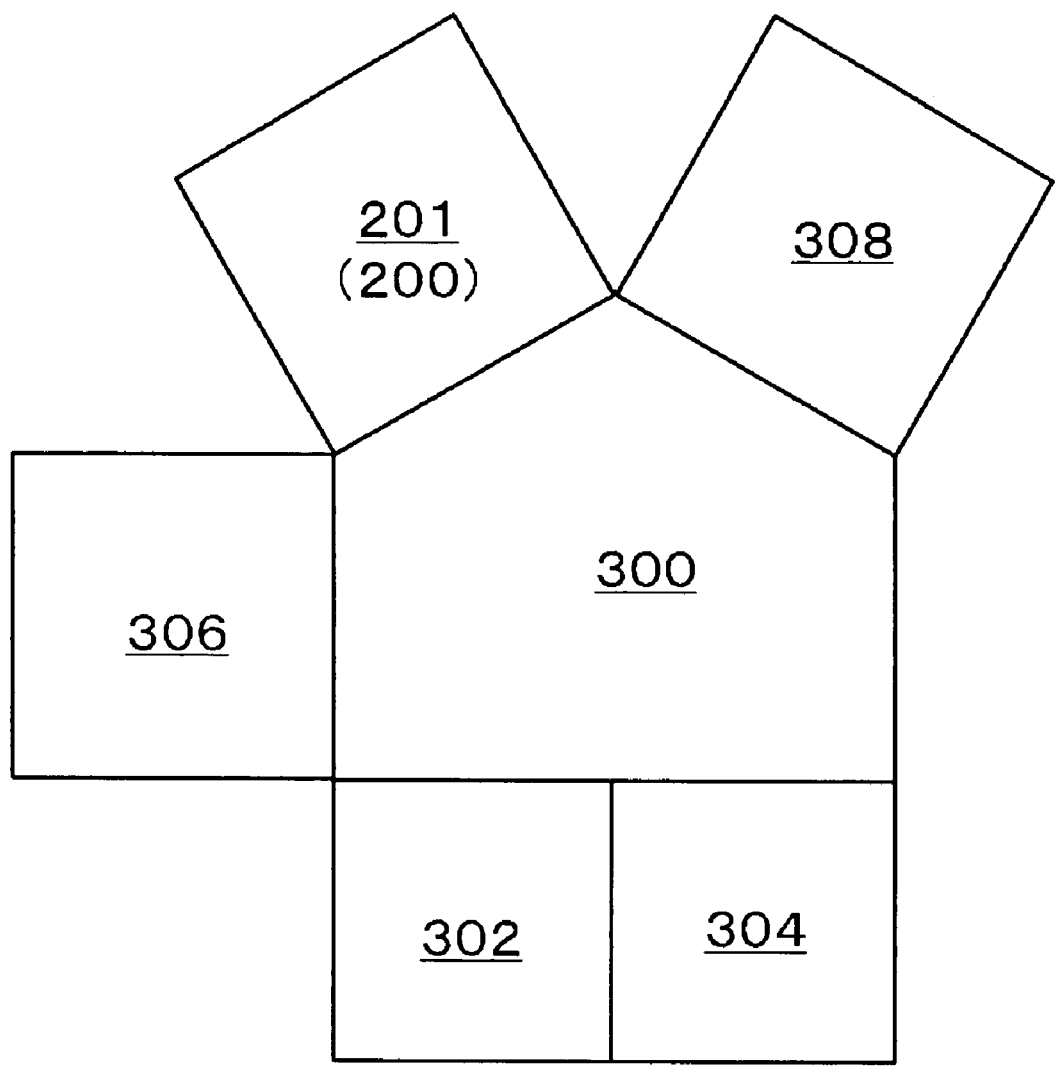
FIG. 10 shows a schematic structure of the apparatus for performing the method according to the embodiment.

This embodiment differs from the first and second embodiments in that the techniques (1) and (3) are used in combination. Etching of the lower resist film 102 in step S112 of FIG. 1 and etching of the film-to-be-etched 101 in step S114 are usually proceed in different process chambers. FIG. 10 shows a schematic structure of the apparatus for performing the method according to the present embodiment. The apparatus further includes a common transfer chamber 300 or the like, load-lock chambers 302 and 304 having a substrate transfer mechanism incorporated therein, an alignment chamber 306 or the like, and an etching chamber 308 in which the film-to-be-etched 101 is etched, in addition to the chamber 201 of the etching apparatus 200 (see FIG. 5). The chamber 201 is communicated, while placing the common transfer chamber 300 or the like respectively in between the load-lock chambers 302 and 304, the alignment chamber 306 or the like and the etching chamber 308. The process will be explained below, referring to FIG. 5.

In this embodiment, fluctuation in the pressure around the semiconductor device 100 is reduced, between the processes in step S112 and step S114 in FIG. 1. The fluctuation in pressure herein may be suppressed to 100 mTorr or below. More specifically, the chamber 201 of the etching apparatus 200, the load-lock chambers 302 and 304, the common transfer chamber 300, the alignment chamber 306 and the etching chamber 308 in which the film-to-be-etched 101 is etched are controlled at an almost constant pressure. Any difference in the pressure among these chambers produces wind pressure ascribable to the pressure difference, and makes the lower resist film more likely to collapse. Whereas control in this embodiment is effected so as to eliminate the pressure difference, so that the wind pressure possibly exerted to the lower resist film can be suppressed, and thereby the collapse can effectively be suppressed.

In the process of etching of the lower resist film 102 in the chamber 201, that is, over the entire series of processes for executing step S112 in FIG. 1, including the step of loading the semiconductor device 100 into the chamber 201, the etching step for the lower resist film 102 (S112), the charge removal step explained in the second embodiment, and the step of unloading the semiconductor device 100 from the chamber 201 before advancing to step S114 in FIG. 1, fluctuation in pressure in the chamber 201 can be reduced.

The pressure in the chamber 201 during etching of the lower resist film 102 may be adjusted typically equal to or more than 0.1 mTorr and equal to or more than 100 mTorr. Side-etching can be suppressed by lowering the pressure in the chamber 201 in this way.

In this embodiment, the wind pressure possibly exerted to the lower resist film can be suppressed, and the collapse can effectively be suppressed, by eliminating pressure difference in the process of transfer of the wafer between each chamber (201 or 308) and the load-lock chamber (302 or 304) after etching of the lower resist film, and by suppressing fluctuation in pressure in the process of the lower resist film.

The foregoing paragraphs have described the embodiments of the present invention, merely as examples of the present invention, allowing any other configurations other than those described in the above.

The three-layered resist film exemplified in the embodiments described in the above may be replaced with double-layered resist film. For the case where the two-layered resist film is used, the lower resist film 102 and the intermediate film 104 are formed in this order on the film-to-be-etched 101. Next, the intermediate film 104 is subjected to light exposure, to thereby pattern the intermediate film 104. Next, the lower resist film 102 is patterned by reactive ion etching through the intermediate film 104 used as a mask. The film-to-be-etched 101 is then processed by dry etching through the stacked film of the intermediate film 104 and the lower resist film 102 used as a mask.

Exemplary techniques of suppressing collapse of the lower resist film explained in the above were combination of (1) and (2) in the second embodiment, and combination of (1) and (3) in the third embodiment, wherein combination of (1) to (3) is also allowable. Further, in addition to (1), (2) and (3) described in the above embodiments, also (4) and (5) described below are effective as techniques of suppressing collapse of the lower resist film:

(4) hardness and elastic modulus of the lower resist film are increased; and (5) adhesiveness between the lower resist film and the underlying film-to-be-etched is increased.

Insufficient strength of the lower resist film can be exemplified as one cause of collapse of the lower resist film after etching. Material design of the lower resist film may therefore be such as ensuring an elastic modulus of at least 4.8 GPa or above, and a hardness of 0.3 GPa or above. The design successfully increases the mechanical strength of the lower resist film, and can ensure desirable results as for suppression of the collapse.

Alternatively, for the purpose of increasing adhesiveness of the lower resist film with the underlying film-to-be-etched, an adhesive layer may be formed on the film-to-be-etched before the lower resist film is formed, and thereon the lower resist film may be formed. By the procedure, it is also made possible to raise the adhesiveness between the film-to-be-etched and the lower resist film. Alternatively, the adhesiveness between the film-to-be-etched and the lower resist film can be raised also by subjecting the film-to-be-etched to plasma treatment before the lower resist film is formed. As described in the above, collapse of the lower resist film can more effectively be suppressed, by increasing the strength of the lower resist film per se, or by increasing adhesiveness between the lower resist film and the underlying film-to-be-etched.

In the second embodiment, it is also allowable to lower the absolute value of voltage of the electrostatic chuck 203 during etching of the lower resist film 102. Residual electric charge in the semiconductor device 100 can thus be reduced.

It is apparent that the present invention is not limited to the above embodiment, that may be modified and changed without departing from the scope and spirit of the invention.

What is claimed is:

1. A method of fabricating a semiconductor device including forming, in an insulating film formed on a semiconductor substrate, an interconnect pattern with a predetermined geometry, using a multi-layered resist film containing at least a lower resist film and a silicon-containing film, comprising:
    judging whether an interconnect pitch of an interconnect pattern having the smallest interconnect pitch out of all interconnect patterns to be formed in said insulating film is not larger than a predetermined value or not;
    if said smallest interconnect pitch is judged as being not larger than a predetermined pitch, in said judging whether said interconnect pitch is not smaller than a predetermined value or not, determining the thickness of said lower resist film corresponding to said smallest interconnect pitch;
    forming said lower resist film having said thickness on said insulating film;
    forming said silicon-containing film on said lower resist film;
    patterning said silicon-containing film according to said predetermined geometry;
    patterning said lower resist film through said silicon-containing film used as a mask; and
    patterning said insulating film through said lower resist film used as a mask.

2. The method of fabricating a semiconductor device as claimed in claim 1,
    wherein, in said judging whether said interconnect pitch is not larger than a predetermined pitch or not, said predetermined pitch is 140 nm.

3. The method of fabricating a semiconductor device as claimed in claim 1,
    wherein, in said determining the thickness of said lower resist film, said thickness of said lower resist film is determined so that said interconnect pattern having said smallest interconnect pitch will have an aspect ratio of 2.5 or smaller.

4. The method of fabricating a semiconductor device as claimed in claim 2,
    wherein, in said determining the thickness of said lower resist film, said thickness of said lower resist film is determined so that said interconnect pattern having said smallest interconnect pitch will have an aspect ratio of 2.5 or smaller.

5. The method of fabricating a semiconductor device as claimed in claim 1, further comprising:
    between said forming said silicon-containing film on said lower resist film and said patterning said silicon-containing film according to said predetermined geometry, forming an upper resist film on said silicon-containing film, and patterning said upper resist film according to said predetermined geometry;
    in said patterning said silicon-containing film according to said predetermined geometry, pattern of said upper resist film is transferred to said silicon-containing film.

6. The method of fabricating a semiconductor device as claimed in claim 1, further comprising:
    between said patterning said lower resist film and said patterning said insulating film, grounding said semiconductor substrate while keeping electrical connection between said semiconductor substrate and said lower resist film.

7. The method of fabricating a semiconductor device as claimed in claim 6, further comprising:
    before said forming said lower resist film, forming said insulating film while leaving the peripheral portion of said semiconductor substrate exposed; and
    in said forming said lower resist film, said lower resist film is formed using an electro-conductive material, and is formed over the entire surface of said semiconductor substrate so that said lower resist film is brought into contact with the peripheral portion of said semiconductor substrate.

8. The method of fabricating a semiconductor device as claimed in claim 6, further comprising:
    before said forming said lower resist film, forming said insulating film while leaving the peripheral portion of said semiconductor substrate exposed; and
    forming an electro-conductive film composed of an electro-conductive material over the entire surface of said semiconductor substrate, so that said electro-conductive film is brought into contact with the peripheral portion of said semiconductor substrate,
    wherein said lower resist film is formed as being brought into contact with said electro-conductive film.

9. The method of fabricating a semiconductor device claimed in claim 6, further comprising:
    before said forming said lower resist film, forming said insulating film while leaving the peripheral portion of said semiconductor substrate exposed; and
    forming an electro-conductive film composed of an electro-conductive material over the entire surface of said semiconductor substrate, so that said electro-conductive film is brought into contact with the peripheral portion of said semiconductor substrate,
    wherein said multi-layered resist film is formed as being brought into contact with said electro-conductive film.

10. The method of fabricating a semiconductor device as claimed in claim 1,
    wherein pressure difference between said patterning said lower resist film and said patterning said insulating film is set to 100 mTorr or below.

* * * * *